(12) United States Patent
Xu et al.

(10) Patent No.: US 11,066,736 B2
(45) Date of Patent: Jul. 20, 2021

(54) VAPOR DEPOSITION DEVICE AND VAPOR DEPOSITION METHOD

(71) Applicant: Shanghai Tianma Micro-Electronics Co., Ltd., Shanghai (CN)

(72) Inventors: Jian Xu, Shanghai (CN); Yaoyang Liu, Shanghai (CN)

(73) Assignee: SHANGHAI TIANMA MICRO-ELECTRONICS CO., LTD., Shanghai (CN)

(*) Notice: Subject to any disclaimer, the term of this patent is extended or adjusted under 35 U.S.C. 154(b) by 283 days.

(21) Appl. No.: 15/959,622

(22) Filed: Apr. 23, 2018

(65) Prior Publication Data

US 2019/0233930 A1 Aug. 1, 2019

(30) Foreign Application Priority Data

Jan. 31, 2018 (CN) .......................... 201810097681.6

(51) Int. Cl.
| | |
|---|---|
| *C23C 14/04* | (2006.01) |
| *C23C 16/04* | (2006.01) |
| *C23C 16/44* | (2006.01) |
| *C23C 14/22* | (2006.01) |

(52) U.S. Cl.
CPC ............ *C23C 14/042* (2013.01); *C23C 14/22* (2013.01); *C23C 16/042* (2013.01); *C23C 16/44* (2013.01)

(58) Field of Classification Search
None
See application file for complete search history.

(56) References Cited

U.S. PATENT DOCUMENTS

2015/0013599 A1* 1/2015 You ..................... H01L 51/56
118/504

FOREIGN PATENT DOCUMENTS

| CN | 106835023 A | 6/2017 |
| CN | 107142450 A | 9/2017 |

OTHER PUBLICATIONS

Hilton (Journal of Magnetism and Magnetic Materials 324 (2012) 2051-2056) (Year: 2012).*
Chinese Office Action dated Dec. 3, 2019 for corresponding CN Application No. 201810097681.6.
CN Office Action dated Jul. 4, 2019 for corresponding CN Application No. 201810097681.6.

* cited by examiner

*Primary Examiner* — Joel G Horning
(74) *Attorney, Agent, or Firm* — Tarolli, Sundheim, Covell & Tummino LLP (57) ABSTRACT

An embodiment of the present disclosure provides a vapor deposition device and a vapor deposition method thereof. The vapor deposition device comprises an adjustable magnet array. The adjustable magnet array comprises m magnet blocks, wherein a magnetization direction of at least one of the magnet blocks is adjustable. The vapor deposition device is used to prepare a film.

7 Claims, 9 Drawing Sheets

VAPOR DEPOSITION DEVICE AND VAPOR DEPOSITION METHOD

CROSS-REFERENCE TO RELATED APPLICATIONS

The present application claims priority to Chinese Patent Application No. 201810097681.6, filed on Jan. 31, 2018, the content of which is incorporated herein by reference in its entirety.

TECHNICAL FIELD

The present disclosure relates to the technical field of vapor deposition, and in particular, to a vapor deposition device and a vapor deposition method.

BACKGROUND

Vapor deposition is a process of vaporizing or sublimating a substance to be film-formed in a vacuum to cause it to be separated out on the surface of a workpiece or a substrate. The process that a vapor deposition material is heated and plated onto the substrate is referred to as vacuum deposition or vacuum coating. The vacuum coating process is widely used in a manufacturing process of an apparatus (such as a display panel).

In the vapor deposition process of the display panel, a mask is used to shield a specific region of a substrate to be vapor-deposited, so that the vapor deposition material is separated out in a non-shielded region to form a film.

With respect to the vacuum vapor deposition technology serving as a main process for preparing a panel at present, how to improve wrinkles of the mask caused by a stretching technology to improve the vapor deposition effect is the major technical problem confronted in the industry.

SUMMARY

The present disclosure provides a vapor deposition device and a vapor deposition method, which are used to improve wrinkles of a mask caused by a stretching technology to improve the vapor deposition effect.

In a first aspect, the present disclosure provides a vapor deposition device, including an adjustable magnet array. The adjustable magnet array includes m magnet blocks. A magnetization direction of at least one of the magnet blocks is adjustable.

In a second aspect, the present disclosure provides vapor deposition method, which is applicable to the vapor deposition device according to the first aspect. The method includes the following steps of: providing a vapor deposition substrate and an evaporation source; adjusting a magnetization direction of at least one of the magnet blocks, such that a magnetic force generated by the adjustable magnet array on a mask provided on the vapor deposition substrate has a component force $F_x$ in a first direction, for removing wrinkles of the mask which extend in a second direction and flattening the surface of the mask; and adjusting a of a component force $F_z$ of the magnetic force generated by the adjustable magnet array on the mask in a third direction to offset a gravity of the mask; and heating the evaporation source to perform vapor deposition on the vapor deposition substrate.

BRIEF DESCRIPTION OF DRAWINGS

The accompanying drawings are briefly introduced as follows. The drawings are not meant to be limiting; those skilled in the art will be able to see alternative drawings without paying creative effort.

DESCRIPTION OF EMBODIMENTS

In order to better understand technical solutions of the present disclosure, the embodiments of the present disclosure are described in details with reference to the drawings. It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects in front and at the back of "/" is an "or" relationship.

It should be understood that although the terms 'first', 'second' and 'third' may be used in the present disclosure to describe directions, these directions should not be limited to these terms. These terms are used only to distinguish the directions from each other. For example, without departing from the scope of the embodiments of the present disclosure, a first direction may also be referred to as a second direction. Similarly, the second direction may also be referred to as the first direction.

It should be noted that, the expressions such as "upper", "lower", "left", "right" and the like mentioned in embodiments of the present disclosure are described with reference to the placement status in the accompanying drawings, and should not be construed as limiting embodiments of the present disclosure. In addition, it should also be understood that, in the context, while referring to an element being formed "above" or "below" another element, it is possible that the element is directly formed "above" or "below" the other element, and it is also possible that the element is formed "above" or "below" the other element via a middle element.

Before the technical solution of the present disclosure is explained in detail, the principle and process of vapor deposition will be briefly introduced.

Figure 1:
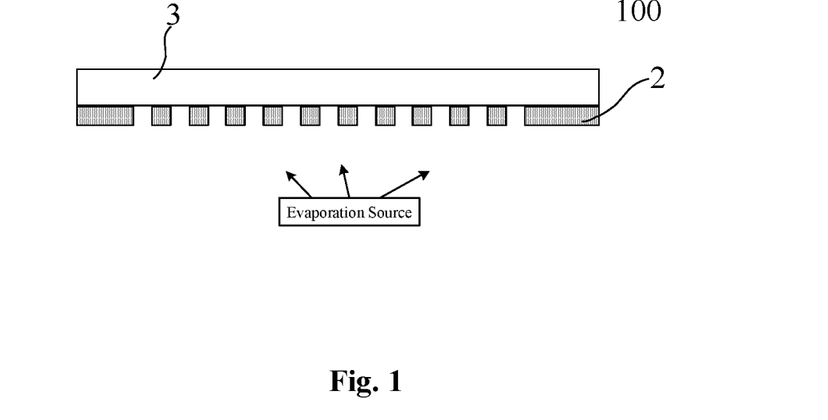
FIG. 1 is a schematic diagram of a vapor deposition principle according to an embodiment of the present disclosure.

FIG. 1 is a schematic diagram of a vapor deposition principle according to an embodiment of the present disclosure. A vapor deposition method (physical vapor deposition method) is mainly used to perform vapor deposition on a substrate to be vapor-deposited. The vapor deposition method includes the following steps: vaporizing the surface of a evaporation source (solid or liquid) into gaseous atoms or molecules; covering, with a mask 2, a region that does not need to be vapor-deposited; depositing the atoms or molecules vaporized into a gaseous state onto a region of the substrate 3 to be vapor-deposited, which needs to be vapor-deposited; and forming a thin film on a specific region on the surface of the substrate to be vapor-deposited.

The vapor deposition of the substrate to be vapor-deposited is generally performed in a vacuum chamber (not shown in drawings). The evaporation source is heated. The vaporized atoms, molecules or ions are agglomerated onto the low-temperature substrate 3 to be vapor-deposited through deposition through holes provided in the mask 2.

In the practical application process, the vapor evaporation process has a very high requirement for the flatness of the mask. However, the mask may be deformed due to the gravity of the mask and/or the substrate to be vapor-deposited, thereby affecting the flatness of the mask and further affecting the vapor deposition effect.

In order to remove the impact of the gravity on the flatness of the mask, a stretching technology is usually used, i.e., a pulling force is applied on the mask, such that the mask is in a tightened state. Under this state, two ends of the mask are fixed on a mask frame. At the same time, as a cooperative measure, a magnetic plate is arranged above the mask, such that a magnetic acting force of the magnetic plate is used to balance the gravity of the mask and/or the substrate to be vapor-deposited, thereby reducing the impacts of the gravity of the mask and/or the substrate to be vapor-deposited on the flatness of a mask.

However, in the stretching process, wrinkles will appear on the surface of the mask as the mask is stretched. The wrinkles extend mainly in a stretching direction, exemplarily such as in a second direction in the present embodiment. The specific appearances and amplitudes of the wrinkles are related to the specific mask. For example, the length, width and thickness of the mask, the nature of a mask material, the shape of a panel, the arrangement of the panel, the shapes of openings, the density of the openings and the like may cause the formation of wrinkles. There are many causes for the formation of the wrinkles, resulting in poor controllability to the wrinkles and further causing a more serious impact on subsequent vapor deposition.

In order to solve the problem of the wrinkles on the mask and improve the vapor deposition effect, the inventor has designed the following technical solutions.

Figure 2:
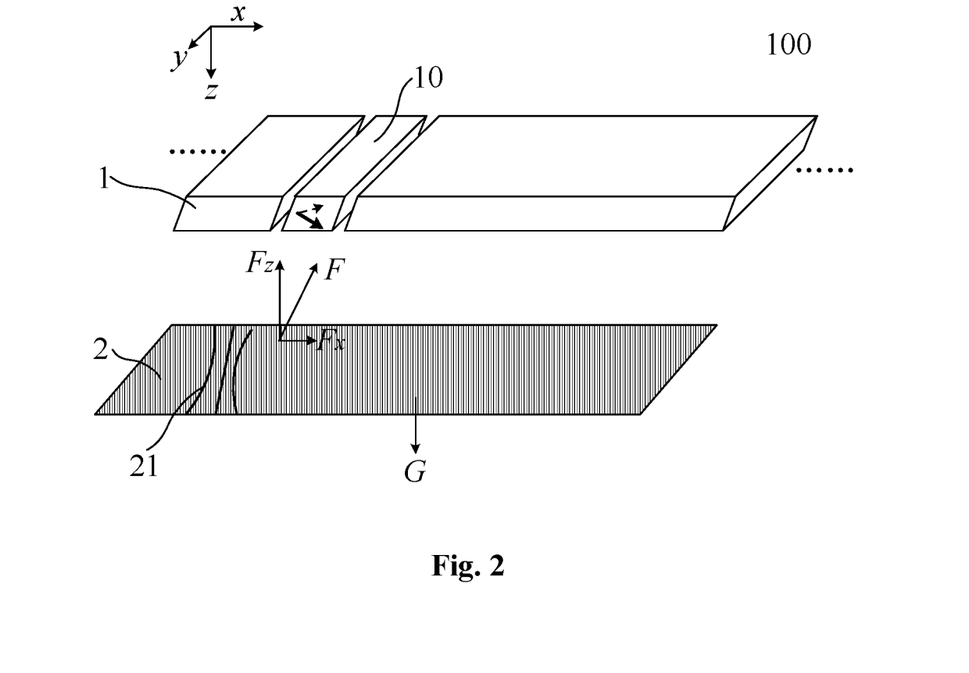
FIG. 2 is a perspective assembly view of a vapor deposition device according to an embodiment of the present disclosure.

The present embodiment provides a vapor deposition device as shown in FIG. 2. FIG. 2 is a perspective assembly view of the vapor deposition device according to the embodiment of the present disclosure. The vapor deposition device 100 includes an adjustable magnet array 1 and a mask 2. The adjustable magnet array 1 includes m magnet blocks 10, wherein m≥1, in which m is a positive integer. A magnetization direction of at least one magnet block 10 is adjustable. As shown in FIG. 2, an initial magnetization direction of the magnet block 10 is indicated by a dotted arrow, and a magnetization direction after adjustment is indicated by a solid arrow. After the magnetization direction of the magnet block 10 is adjusted, a magnetic force F generated by the adjustable magnet array 1 on the mask 2 has a component force $F_x$ in a first direction x, so as to remove wrinkles 21 of the mask 2 which extend in a second direction y, and flatten the surface of the mask 2.

In addition, the magnitude of the component force $F_z$ of the magnetic force F generated by the magnet array 1 on the mask 2 in a third direction z is adjusted to offset the gravity G of the mask 2 and/or the substrate 3 to be vapor-deposited. It may be understood that, in the embodiment shown in FIG. 2, before the magnetization direction of the magnet block 10 is adjusted, the adjustable magnet array 1 only has a magnetic force $F_z$ in the third direction z that may be used to remove the gravity G of the mask 2 and/or the substrate 3 to be vapor-deposited. After the magnetization direction of at least one magnet block 10 is adjusted, a magnetic force F generated by the adjustable magnet array 1 on the mask 2 will generate a component force $F_x$ in the first direction x. Finally, it is necessary to adjust the magnitude of the component force in the third direction z. For example, the magnitude of the component force $F_z$ in the third direction z may be adjusted by adjusting a distance between the mask 2 and the adjustable magnet array 1, such that the component force $F_z$ in this direction is equal to G.

It should be noted that "the adjustable magnet array 1 includes m magnet blocks 10" may be understood in the following two forms: in the first form, the adjustable magnet array 1 consists of m magnet blocks 10; and in the second form, the adjustable magnet array 1 may be understood as a case where a non-adjustable magnet array is provided with at least one adjustable magnet block 10 at a specific position (where it is required to generate a component force $F_x$ in the first direction x), and as shown in FIG. 2 exemplarily, an adjustable magnet block 10 is arranged between two magnet arrays. In addition, the mask 2 is made of a ferromagnetic material, which, exemplarily, may be Invar 36 or Super Invar. The adjustable magnet array 1 may be made of a permanent magnet, which, exemplarily, may be a SmCo magnet, a NdFeB magnet, an AlNiCo magnet, or the like. Therefore, when the mask 2 is arranged within a magnetic field range of the adjustable magnet array 1, the adjustable magnet array 1 generates a magnetic force F on the mask 2. In addition, exemplarily, as show in this example, the first direction x is perpendicular to the second direction y, and the third direction z is perpendicular to a plane where the first direction x and the second direction y are located. Since the wrinkles are generated during a stretching process, the wrinkles extend mainly in a stretching direction, which may be understood as the second direction y shown in the present embodiment. At this time, the wrinkles may be removed by means of the component force $F_x$ in the first direction x (perpendicular to the second direction y).

In the related art, during the vapor deposition process, the mask may be provided with a transition region. The transition region is provided with a transition hole, but the transition hole is not used for vapor deposition. The transition hole directs to adjust the position where the wrinkles are located, by using the transition region with the transition hole. By keeping the wrinkles away from a vapor deposition region, or by adjusting the appearances of the wrinkles, the amplitudes of the wrinkles are reduced to improve the conditions of the wrinkles, thereby improving the vapor deposition effect. However, this approach also fails to fundamentally remove the wrinkles, and especially in products, such as high-resolution (PPI, Pixels Per Inch) display screens, or specially-shaped display screens (non-rectangular display screens, such as a circular display screen, or a display screen with recesses), the problems resulting from these wrinkles are difficult or even impossible to solve by arranging the transition hole.

In the present embodiment, by adjusting the magnetization direction of the at least one magnet block 10 in the adjustable magnet array 1, the magnetic force generated by the adjustable magnet array 1 on the mask 2 generates a component force $F_x$ in the first direction x perpendicular to the wrinkles, so as to remove the wrinkles. In addition, in the present embodiment, the one or more magnet blocks 10 in the adjustable magnet array 1 may be adjusted according to the appearances of the wrinkles, such that the component force $F_x$ in the first direction x can remove the wrinkles.

As an example, the magnet block 10 shown in FIG. 2 is in a shape of a cuboid. However, the magnet block 10 may also be in a shape of a cylinder, a cube or a polygonal cylinder in the present embodiment. The specific shapes of the magnet block 10 are not particularly limited in the present embodiment. In addition, FIG. 2 exemplarily illustrates a part of an adjustable magnet array in a row or a column. In fact, the adjustable magnet array 1 in this example is composed of a plurality of rows and a plurality of columns. In order to illustrate the magnetic force of the adjustable magnet array 1 on the mask 2 clearly, the substrate 3 to be vapor-deposited is not shown in FIG. 2 and the following drawings involved below. The positional relationship between the substrate 3 to be vapor-deposited, and the adjustable magnet array 1 and the mask 2 may be as shown in FIG. 1.

Figure 3:
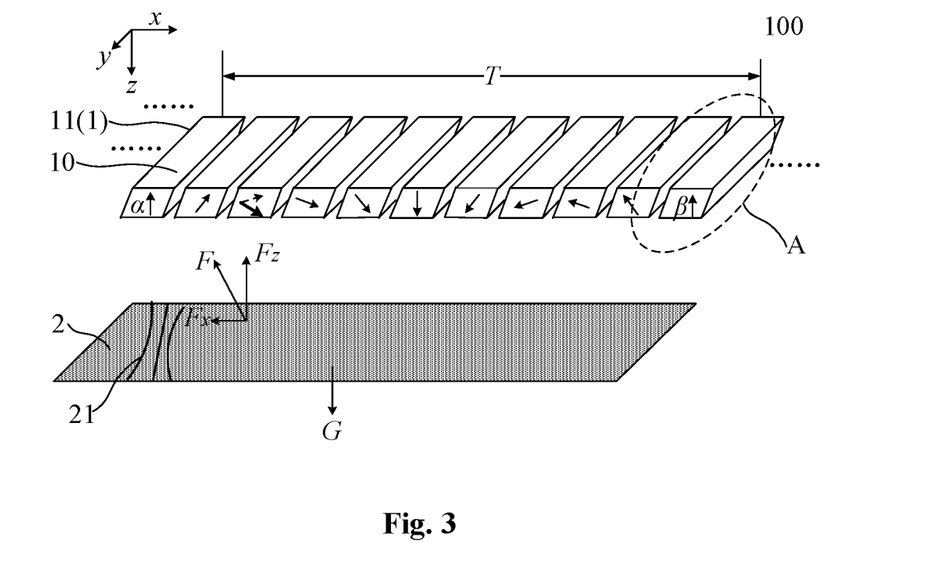
FIG. 3 is a structural schematic diagram of the vapor deposition device according to the embodiment of the present disclosure.

In an implementation, FIG. 3 is a structural schematic diagram of a vapor deposition device according to an embodiment of the present disclosure. The adjustable magnet bock 1 is composed of m magnet bocks 10. In addition, the adjustable magnet array 1 includes at least one magnetization unit 11, that is to say, each magnetization unit 11 may include m magnet blocks 10.

Further, in an implementation, the adjustable magnet array 1 is composed of at least one magnetization unit 11, that is, the adjustable magnet array 1 in the present embodiment may include a plurality of magnetization units 11. The specific number of the magnetization units included in the adjustable magnet array 1 is not limited in the present embodiment. The number of the magnetization units 11 included in the adjustable magnet array 1 may be determined according to specific products.

In addition, referring to FIG. 3, the magnetization unit 11 may include N magnet blocks which are arranged consecutively, where N≥1. A magnetization direction of the magnetization unit 11 is continuously precessed from an angle α to an angle β clockwise or counterclockwise, where $0°<|β-α|≤360°$. The rotation from the angle α to the angle β is defined as one magnetization unit 11. The length T of the magnetization unit 11 may be obtained according to the following formula: T=N(D+s).

Figure 4:
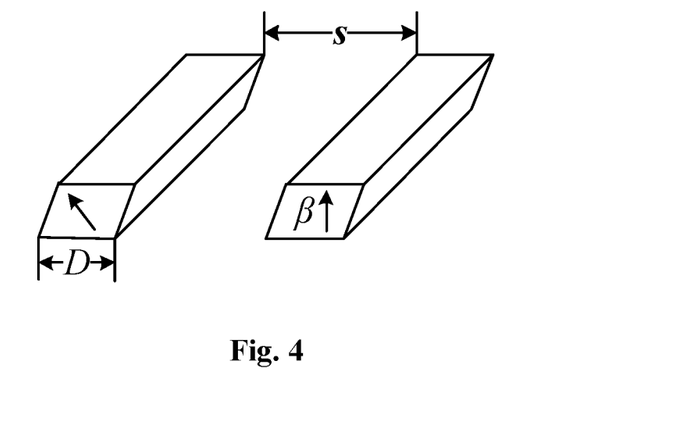
FIG. 4 is a partially enlarged schematic diagram of a position A in FIG. 3 according to the embodiment of the present disclosure.

FIG. 4 is a partially enlarged schematic diagram of a position A in FIG. 3 according to an embodiment of the present embodiment. D represents a diameter of the magnet block 10. According to the orientations shown in FIG. 4, the diameter of the magnet block 10 may be understood as a width of the cuboid magnet block in the first direction x; s represents a gap between adjacent two magnet blocks 10. In the present embodiment, by adjusting the diameter D of the magnet block 10, the range of the length T of the magnetization unit may be controlled, to further obtain the magnitude range of the magnetic force F of the adjustable magnet array 1 on the mask 2. Alternatively, the range of the length T of the magnetization unit may be controlled by adjusting the gap s between the adjacent two magnet blocks 10, to further obtain the magnitude range of a different magnetic force F of the adjustable magnet array 1 on the mask 2. After an adjustable magnet array 1 is made, it is meant that the diameter D of the magnet block and the size of the gap s between the magnet blocks are fixed, and the length T of the magnetization unit is controlled by adjusting the included number N of magnets, to further obtain a different magnetic force F of the adjustable magnet array 1 on the mask 2. Further, in combination with the above embodiments, the component force $F_x$ of the adjustable magnet array 1 on the mask 2 in the first direction x may be obtained. The component force $F_x$ is used to remove the wrinkles and flatten the surface of the mask, so that the flatness of the mask is higher and the vapor deposition effect is better.

It should be noted that, as an example, there are 11 magnet blocks 10 in total from left to right in FIG. 3, where N=11. An angle of the magnetization direction of the first magnet block 10 on the left is α, where α=0°. Each magnet block 10 from left to right is precessed clockwise by a certain angle until the angle of the magnetization direction of the last magnet block 10 is β, where β=360°.

Further, in an implementation, $|β-α|=360°$, i.e., α may be any angle between 0° and 360°. Similarly, β may be any angle between 0° and 360°. The angle α of the first magnet block and the angle β of the last magnet block in the magnetizing unit 11 may be determined by a specific product.

Figure 5:
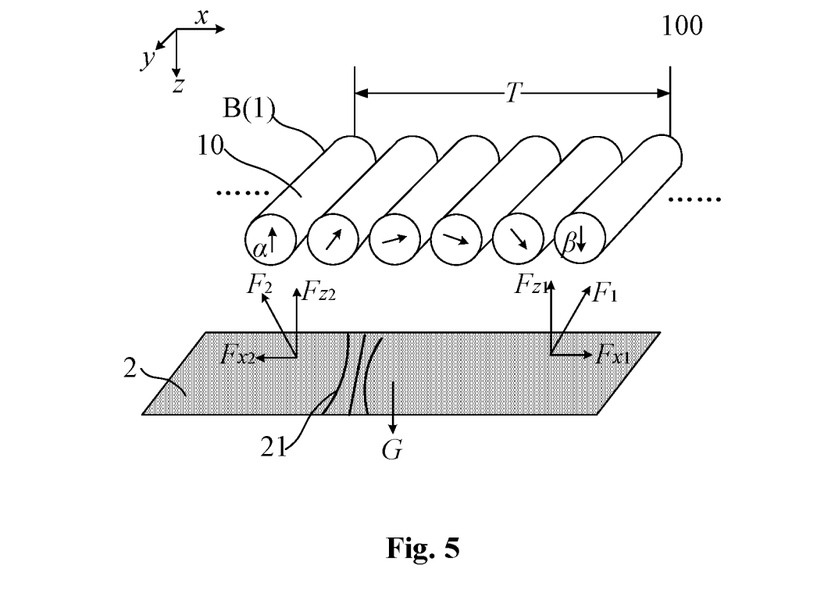
FIG. 5 is another structural schematic diagram of the vapor deposition device according to the embodiment of the present disclosure.

Exemplarily, FIG. 5 is yet another structural schematic diagram of a vapor deposition device according to an embodiment of the present disclosure. In the event that $|β-α|≠360°$, the adjustable magnet array 1 may be referred to as an adjustable magnet array B. The length T of the adjustable magnet array B is adjusted according to the appearances of the wrinkles appearing on the mask 2, thereby adjusting the position of the component force $F_x$ of the adjustable magnet array 1 on the mask 2 in the first direction x. The magnitudes of α and β are adjusted to further adjust the magnitude of the component force $F_x$ of the adjustable magnet array 1 on the mask 2 in the first direction x.

Figure 6:
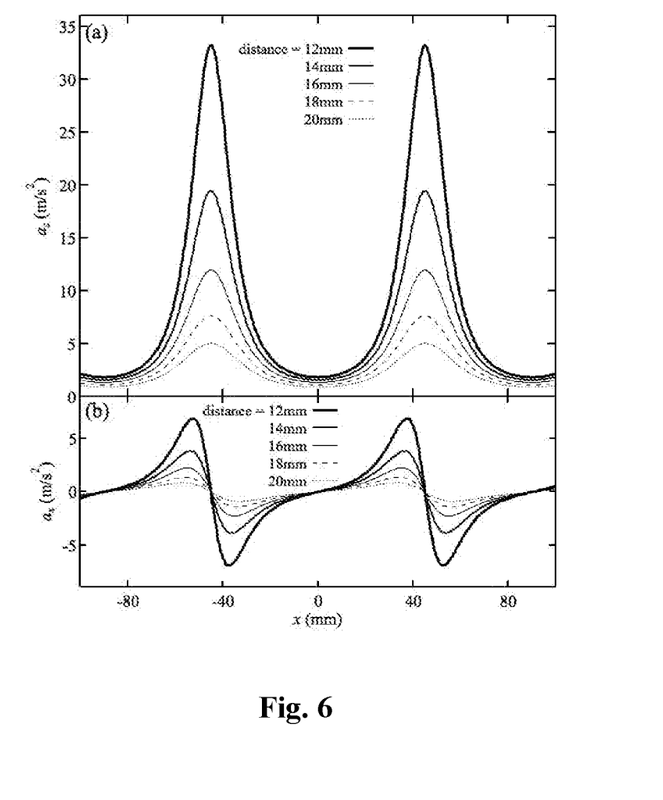
FIG. 6 is a schematic diagram of a change relationship of accelerations of a mask and an adjustable magnet array in a first direction and a third direction along with a position at different distances according to an embodiment of the present disclosure.

As shown in FIG. 5 and FIG. 6, the present embodiment is introduced in detail. FIG. 5 is yet another structural schematic diagram of a vapor deposition device according to the present embodiment. FIG. 6 is a schematic diagram of a change relationship of accelerations of the mask and the adjustable magnet array in a first direction and a third direction along with a position x at different distances according to an embodiment of the present disclosure and makes a detailed introduction for an adjustment manner as shown in FIG. 5. (a) and (b) in FIG. 6 are respectively a schematic diagram of a change relationship of accelerations $a_z$ and $a_x$ of the mask 2 and the adjustable magnet array 1 in a third direction and a first direction along with a position x at different distances according to an embodiment of the present disclosure. Since the attractive force suffered by the mask 2 from the adjustable magnet array 1 is directly proportional to the self size of the mask 2, i.e., the magnetic force changes with a change in the size of the mask 2, the magnitude of the magnetic force cannot reflect well the impact of the adjustable magnet array 1 on the mask 2. However, the magnitude of the acceleration may intuitively reflect the magnitude of the attractive force suffered by the mask 2 from the adjustable magnet array 1. Therefore, the attractive force suffered by the mask 2 from the adjustable magnet array 1 may be converted into an acceleration, and the acceleration may be decomposed in the first direction x and the third direction z, such that an acceleration component (referred to as an acceleration $a_x$ in the first direction x) and an acceleration component (referred to as an acceleration $a_z$ in the third direction z) of the mask 2 in the first direction x and in the third direction z may be obtained. As shown in FIG. 6, the horizontal coordinate shown in FIG. 6 represents a position in the first direction x, with a unit of millimeter (mm). The vertical coordinates shown by (a) and (b) in FIG. 6 represent the acceleration $a_z$ and the acceleration $a_x$ of the mask 2 in the third direction z and in the first direction x respectively, with a unit of metre per second squared (m/s²). The distance represents a distance $z_0$ between the mask 2 and the adjustable magnet array 1 in the third direction z. The magnetic force F generated by the adjustable magnet array 1 on the mask 2 is in a monotonously decreasing relationship with the distance $z_0$ between the mask 2 and the adjustable magnet array 1 in the third direction z, that is, the smaller the distance $z_0$ is, the larger the magnetic force F is. Exemplarily, taking the distance $z_0$=12 mm as an example, the mask 2 has a component $F_{x1}$ in a positive direction of the x-axis within a range of 0 to 45 mm in the first direction x, which is converted into an acceleration $a_{x1}$ in the first direction x, and has a component $F_{z1}$ within a range of 0 to 45 mm in the third direction z, which is converted into an acceleration $a_{z1}$ in the third direction z, and the resultant force in both directions is $F_1$ which is converted into a resultant acceleration $a_1$; the mask 2 has a component $F_{x2}$ in a negative direction of the x-axis within a range of −45 to 0 mm in the first direction x, which is converted into an acceleration $a_{x2}$ in the first direction x, and has a component $F_{z2}$ within a range of −45 to 0 mm in the third direction z, which is converted into an acceleration $a_{z2}$ in the third direction z, and the resultant force in both directions is $F_2$ which is converted into a resultant acceleration $a_2$, exemplarily as shown in FIG. 5. The magnetic force $F_1$ and the magnetic force $F_2$ cooperate together. The component forces $F_{x1}$ and $F_{x2}$ in the first direction x are used to remove the wrinkles. The component force $F_z$ in the third direction z is used to balance the gravity G of the mask 2 and/or the substrate 3 to be vapor-deposited.

In addition, it needs to be added that in the present embodiment, the magnitude and/or position of the component force $F_x$ of the adjustable magnet array 1 on the mask 2 in the first direction x may be adjusted for different appearances of different wrinkles, such that the wrinkles are removed fundamentally.

With reference to the implementation shown in FIG. 5, in yet another implementation, the distance between the adjustable magnet array 1 and the mask 2 in the third direction z is expressed as $z_0$. The magnitude of the component force $F_z$ and the component force $F_x$ of the magnetic force F generated by the adjustable magnet array 1 on the mask 2 in the third direction z and the first direction x respectively may be adjusted by adjusting the angle α and/or β of the magnetization direction, the length T and the distance $z_0$. Therefore, an appropriate component force $F_x$ is obtained in the first direction x to remove the wrinkles, and an appropriate component force $F_z$ is obtained in the third direction z to balance the gravity G of the mask 2 and/or the substrate 3 to be vapor-deposited. Exemplarily, the distance $z_0$ between the adjustable magnet array 1 and the mask 2 in the third direction z is in a monotonically decreasing relationship with the magnetic force F generated by the adjustable magnet array 1 on the mask 2, that is, the smaller the distance $z_0$ is, the larger the magnetic force F is, so the magnitude of the magnetic force F may be adjusted by adjusting the distance $z_0$.

Exemplarily, in the event that |β−α|=360°, the adjustable magnet array composed of the magnetization units 11 of magnets may be referred to as a Halbach magnet array. Based on the Halbeck magnet array, there are the following two manners by which the magnetic force F generated by the adjustable magnet array 1 on the mask 2 has a component force Fx in the first direction x.

Figure 7:
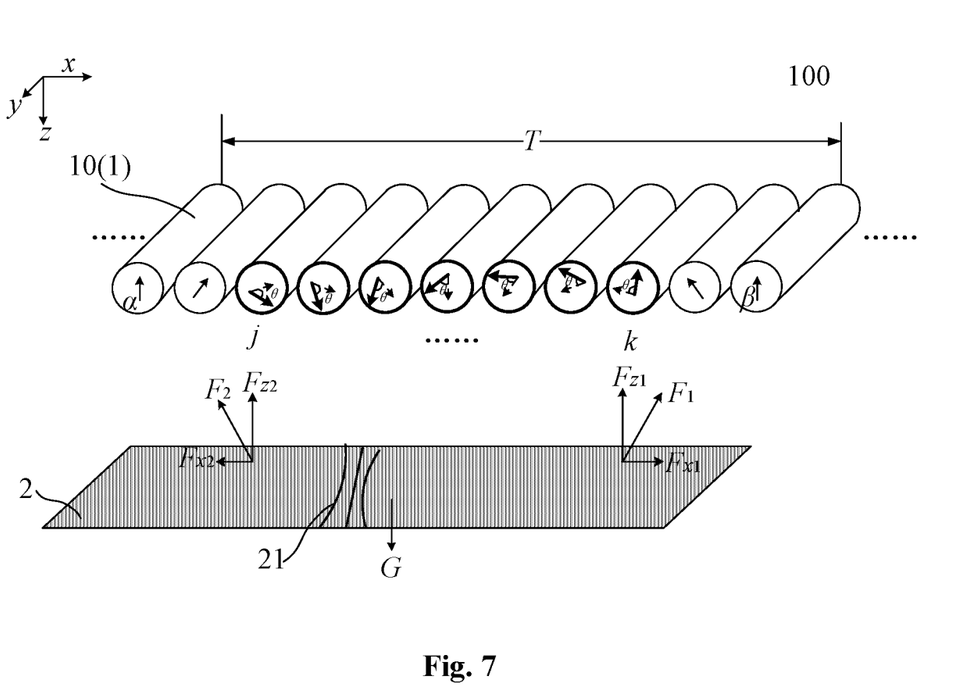
FIG. 7 is yet another structural schematic diagram of a vapor deposition device according to an embodiment of the present disclosure.

For the first manner, in a specific implementation, FIG. 7 illustrates yet another structural schematic diagram of a vapor deposition device according to an embodiment of the present disclosure. The adjustable magnet array is a Halbeck magnet array before adjustment. Based on the Halbeck magnet array, the magnetization directions of j-th to k-th consecutive magnet blocks 10 are adjusted, such that the magnetic force F generated by the adjustable magnet array 1 on the mask 2 has a component force $F_x$ in the first direction x, where 1≤j≤k≤m. As shown in FIG. 7, the magnetization directions of j-th to k-th consecutive magnet blocks 10 are adjusted, i.e., the j-th to k-th consecutive magnet blocks 10 are adjusted in a clockwise direction or an anticlockwise direction. In FIG. 7, the dotted arrow refers to a magnetization direction before adjustment, and a solid arrow refers to a magnetization direction after adjustment. After the magnetization directions of the j-th to k-th consecutive magnet blocks 10 are adjusted, the magnetic force F has a component force $F_x$ in the first direction x. The component force $F_x$ is used to remove the wrinkles of the mask in the second direction y, such that the surface of the mask is flat. Exemplarily, a magnetic force $F_1$ and a magnetic force $F_2$ are generated on the left and right sides on the basis of the orientations shown in FIG. 7. The magnetic force $F_1$ generates a component force $F_{x1}$ to the right in the first direction x, the magnetic force $F_2$ generates a component force $F_{x2}$ to the left in the first direction x, and the component force $F_{x1}$ and the component force $F_{x2}$ cooperate together to remove the wrinkles on the mask 2. In addition, the component forces $F_{z1}$ and $F_{z2}$ in the third direction z are used to balance the gravity G of the mask 2 and/or the substrate 3 to be vapor-deposited.

Further, as shown in FIG. 7, the magnetization directions of the j-th to k-th consecutive magnet blocks 10 are adjusted, to be specific: the magnetization directions of the j-th to k-th consecutive magnet blocks 10 are precessed by an angle θ respectively, where 0°<θ<360°. That is, the rotation angle θ may be any angle between 0° and 360°, such that the rotation direction may be precessed counterclockwise or clockwise. The rotation angle θ and the clockwise or counterclockwise rotation are not particularly limited in the present embodiment, and may be based on the position of wrinkles appearing on a particular product and the magnitude and direction of the magnetic force F required to remove the wrinkles.

Figure 8:
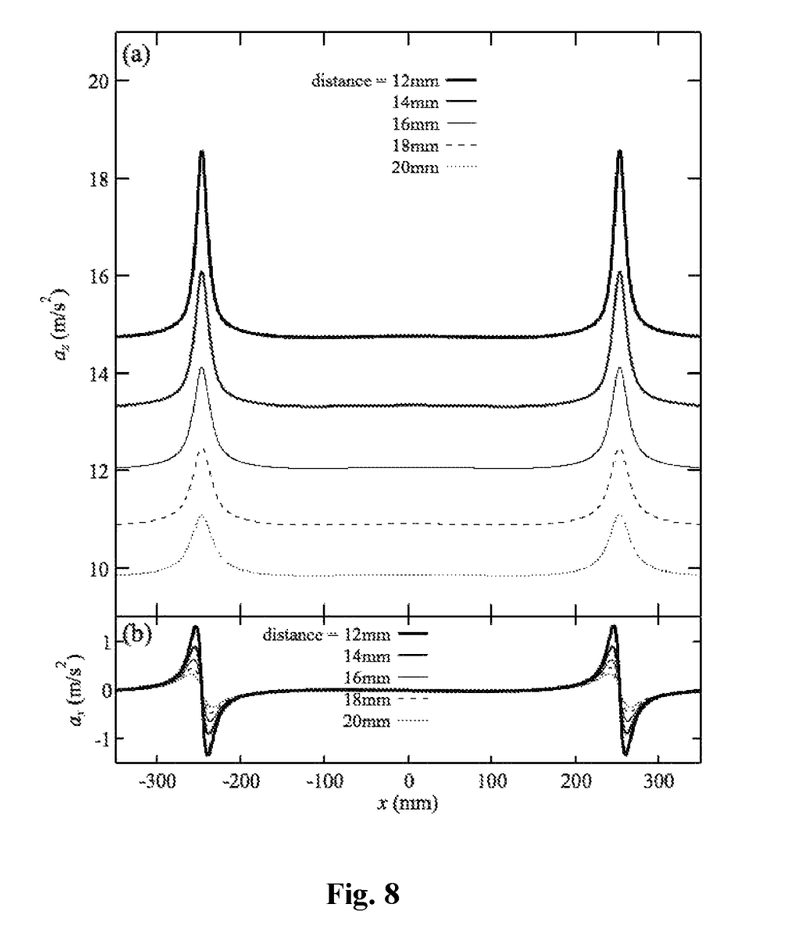
FIG. 8 is a schematic diagram of yet another change relationship of accelerations of the mask and the adjustable magnet array in the first direction and the third direction along with a position at different distances according to an embodiment of the present disclosure.

With reference to FIG. 7 and FIG. 8, the first adjustment manner is described in detail. (a) and (b) in FIG. 8 are respectively a schematic diagram of a change relationship of accelerations $a_z$ and $a_x$ of the mask 2 and the adjustable magnet array 1 in the third direction and the first direction along with a position x at different distances according to an embodiment of the present disclosure. Since the attractive force suffered by the mask 2 from the adjustable magnet array 1 is directly proportional to the self size of the mask 2, i.e., the magnitude of the magnetic force changes with a change in the size of the mask 2, the magnitude of the magnetic force cannot reflect well the impact of the adjustable magnet array 1 on the mask 2. However, the magnitude of the acceleration may intuitively reflect the magnitude of the attractive force suffered by the mask 2 from the adjustable magnet array 1. Therefore, the attractive force suffered by the mask 2 from the adjustable magnet array 1 may be converted into an acceleration, and the acceleration may be decomposed in the first direction x and the third direction z, such that an acceleration component (referred to as an acceleration $a_x$ in the first direction x) and an acceleration component (referred to as an acceleration $a_z$ in the third direction z) of the mask 2 in the first direction x and in the third direction z respectively may be obtained. As shown in FIG. 8, the horizontal coordinate shown in FIG. 8 represents a position in the first direction x, with a unit of millimeter (mm). The vertical coordinates shown by (a) and (b) in FIG. 8 represent the acceleration $a_z$ and the acceleration $a_x$ of the mask 2 in the third direction z and in the first direction x respectively, with a unit is metre per second squared (m/s$^2$). The distance represents a distance $z_0$ between the mask 2 and the adjustable magnet array 1 in the third direction z. The magnetic force F generated by the adjustable magnet array 1 on the mask 2 is in a monotonously decreasing relationship with the distance $z_0$ between the mask 2 and the adjustable magnet array 1 in the third direction z, that is, the smaller the distance $z_0$ is, the larger the magnetic force F is. Exemplarily, taking the distance z0=12 mm as an example, the mask 2 has a component $F_{x1}$ in a positive direction of the x-axis near a position $x_1$=240 mm in the first direction x, which is converted into an acceleration $a_{x1}$ in the first direction x, and has a component $F_{z1}$ in a negative direction of the x-axis near a position $x_1$=240 mm in the third direction z, which is converted into an acceleration $a_{z1}$ in the third direction z, and the resultant force in both directions is $F_1$ which is converted into a resultant acceleration $a_r$. The mask 2 has a component $F_{x2}$ near a position $x_2$=−240 mm in the first direction x, which is converted into an acceleration $a_{x2}$ in the first direction x, and has a component $F_{z2}$ near the position $x_2$=−240 mm in the third direction z, which is converted into an acceleration $a_{z2}$ in the third direction z, and the resultant force in both directions is $F_2$ which is converted into a resultant acceleration $a_2$, exemplarily as shown in FIG. 7. The magnetic force $F_1$ and the magnetic force $F_2$ cooperate together. The component forces $F_{x1}$ and $F_{x2}$ in the first direction x are used to remove the wrinkles. The component force $F_z$ in the third direction z is used to balance the gravity G of the mask 2 and/or the substrate 3 to be vapor-deposited.

Figure 9:
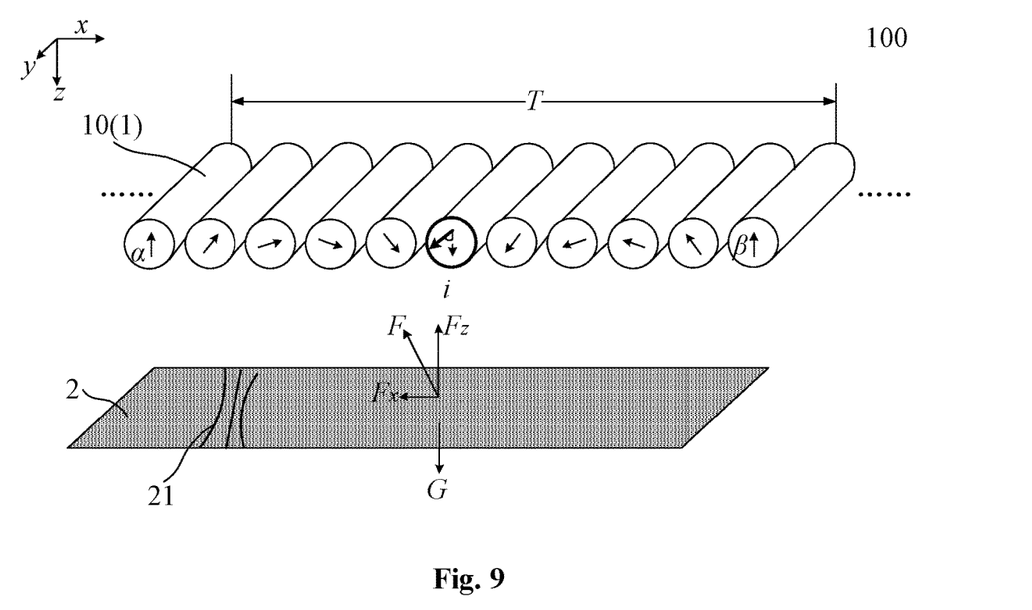
FIG. 9 is yet another structural schematic diagram of a vapor deposition device according to an embodiment of the present disclosure.

For the second manner, in yet another specific implementation, FIG. 9 illustrates yet another structural schematic diagram of the vapor deposition device according to the embodiment of the present disclosure. The magnetization direction of the i-th magnet block 10 is adjusted, such that the magnetic force F generated by the adjustable magnet array 1 on the mask 2 has a component force $F_x$ in the first direction x, The component force $F_x$ is used to remove the wrinkles of the mask 2 in the second direction y, such that the surface of the mask 2 is flat, where 1≤i≤m. The i-th magnet block in the present embodiment is any one of the m magnet blocks.

Figure 10:
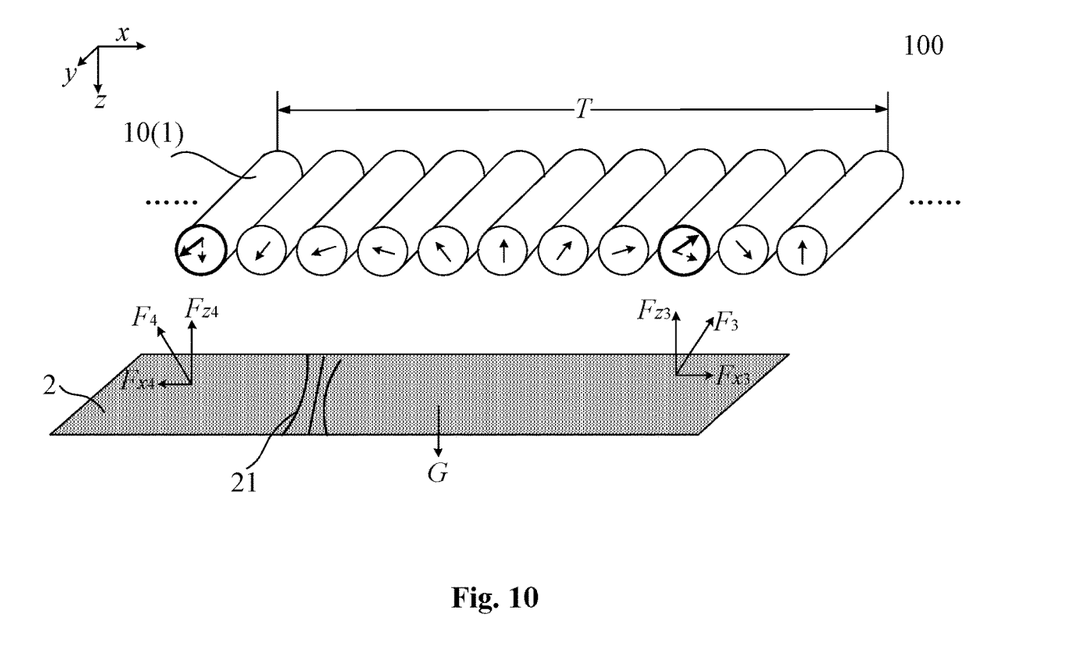
FIG. 10 is yet another structural schematic diagram of a vapor deposition device according to an embodiment of the present disclosure.
Figure 11:
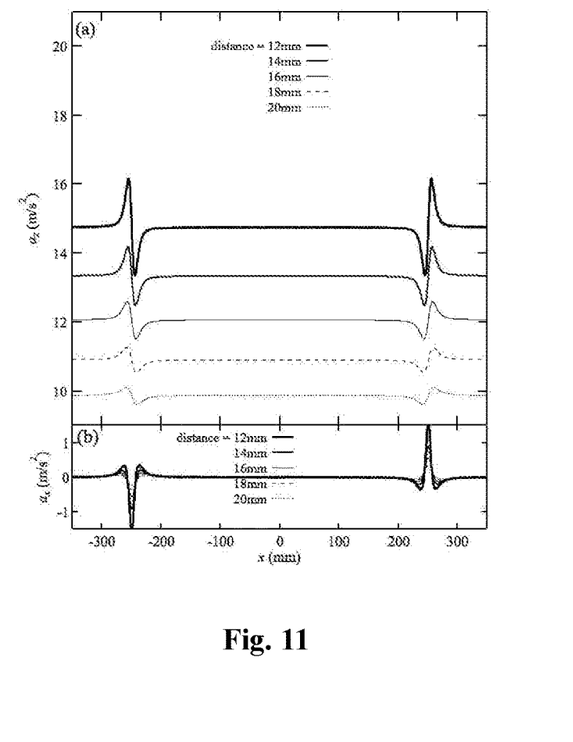
FIG. 11 is yet another schematic diagram of a change relationship of accelerations of the mask and the adjustable magnet array in the first direction and the third direction along with a position at different distances according to an embodiment of the present disclosure.

With reference to FIG. 10 and FIG. 11, the second adjustment manner in this example is described in detail. FIG. 10 is yet another structural schematic diagram of the vapor deposition device according to the embodiment of the present disclosure. FIG. 11 is another schematic diagram of a change relationship of accelerations of the mask and the adjustable magnet array in the first direction and the second direction along with a position at different distances according to an embodiment of the present disclosure. Taking the orientations shown in FIG. 10 as a reference, the magnetization directions of the first magnet block 10 and the ninth magnet block 10 from left to right are adjusted to obtain the component forces of the adjustable magnet array 1 on the mask 2 in the first direction x and the third direction z. Since the attractive force suffered by the mask 2 from the adjustable magnet array 1 is directly proportional to the self size of the mask 2, i.e., the magnitude of the magnetic force changes with a change in the size of the mask 2, the magnitude of the magnetic force cannot reflect well the impact of the adjustable magnet array 1 on the mask 2. However, the magnitude of the acceleration may intuitively reflect the magnitude of the attractive force suffered by the mask 2 from the adjustable magnet array 1. Therefore, the attractive force suffered by the mask 2 from the adjustable magnet array 1 may be converted into an acceleration, and the acceleration may be decomposed in the first direction x and the third direction z, such that an acceleration component (referred to as an acceleration $a_x$ in the first direction x) and an acceleration component (referred to as an acceleration $a_z$ in the third direction z) of the mask 2 in the first direction x and in the third direction z respectively may be obtained. The horizontal coordinate shown in FIG. 11 represents a position in the first direction x, with a unit of millimeter (mm). The vertical coordinates shown by (a) and (b) in FIG. 11 represent the acceleration $a_z$ and the acceleration $a_x$ of the mask 2 in the third direction z and in the first direction x respectively, with a unit of metre per second squared (m/s$^2$). The distance represents a distance $z_0$ between the mask 2 and the adjustable magnet array 1 in the third direction z. The magnetic force F generated by the adjustable magnet array 1 on the mask 2 is in a monotonously decreasing relationship with the distance $z_0$ between the mask 2 and the adjustable magnet array 1 in the third direction z, that is, the smaller the distance $z_0$ is, the larger the magnetic force F is. Exemplarily, taking the distance z0=12 mm as an example, the mask 2 has a component $F_{x3}$ in a positive direction of the x-axis at a position $x_3$=250 mm in the first direction x, which is converted into an acceleration $a_{x3}$ in the first direction x, and has a component $F_{z3}$ at a position $x_3=250$ mm in the third direction z, and the resultant force in both directions is $F_3$ which is converted into a resultant acceleration $a_3$. The mask 2 has a component $F_{x4}$ at a position $x_4=-250$ mm in the first direction x, which is converted into an acceleration $a_{x4}$ in the first direction x, and has a component $F_{z4}$ at the position $x_4=-250$ mm in the third direction z, which is converted into an acceleration $a_{z4}$ in the third direction z, and the resultant force in both directions is $F_4$, which is converted into a resultant acceleration is $a_4$. The magnetic force $F_3$ and the magnetic force $F_4$ cooperate together. The component forces $F_{x3}$ and $F_{x4}$ in the first direction x are used to remove the wrinkles. The component force $F_z$ in the third direction z is used to balance the gravity G of the mask 2 and/or the substrate 3 to be vapor-deposited.

It may be understood that in the present example, the magnetization directions of the j-th to k-th consecutive magnet blocks 10 may be adjusted according to the appearances of the wrinkles. Alternatively, it is possible to adjust the magnetization direction of the i-th magnet block 10 only. That is, in order to obtain the component force $F_x$ whose direction is reversed in the first direction x, the first manner may be adopted to continuously adjust the magnetization directions of the j-th to k-th magnet blocks 10; alternatively, it is possible to adjust the magnetization direction of the i-th magnet block 10 only to obtain the component force $F_x$ whose direction is hardly reversed in the first direction x.

In an implementation, as shown in FIG. 5, FIG. 7, FIG. 9 and FIG. 10, the magnet block 10 in the present embodiment may be in a shape of a cylinder. The magnet block 10 in the present embodiment may also be in a shape of a cube, a polygonal cylinder, or the like.

Figure 12:
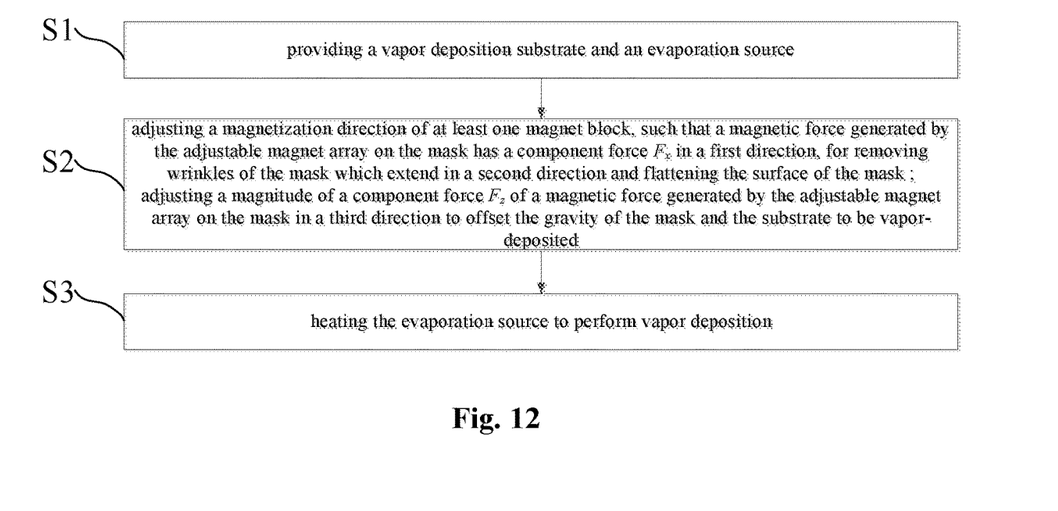
FIG. 12 is a schematic flowchart of a vapor deposition method according to an embodiment of the present disclosure.

The present embodiment provides a vapor evaporation method. FIG. 12 is a schematic flowchart of the vapor deposition method according to the embodiment of the present disclosure. The vapor deposition method is applicable to the vapor deposition device 100 mentioned in the present embodiment.

The vapor deposition method includes the following steps:

S1, providing a vapor deposition substrate and an evaporation source;

S2, adjusting a magnetization direction of at least one magnet block, such that a magnetic force generated by the adjustable magnet array on the mask has a component force $F_x$ in a first direction, so as to remove wrinkles of the mask which extend in a second direction, and flatten the surface of the mask; adjusting the magnitude of a component force $F_z$ of a magnetic force generated by the adjustable magnet array on the mask in a third direction to offset the gravity of the mask and the substrate to be vapor-deposited; and S3, heating the evaporation source to perform vapor deposition.

In an implementation, the adjustable magnet array is composed of m magnet blocks. The adjustable magnet array includes at least one magnetization unit. The magnetization unit includes N magnet blocks which are arranged consecutively, and a magnetization direction of the magnetization unit is continuously precessed from an angle α to an angle β clockwise or counterclockwise. The length of the magnetization unit is T, and a distance between the adjustable magnet array and the mask in the third direction z is $z_0$.

Figure 13:
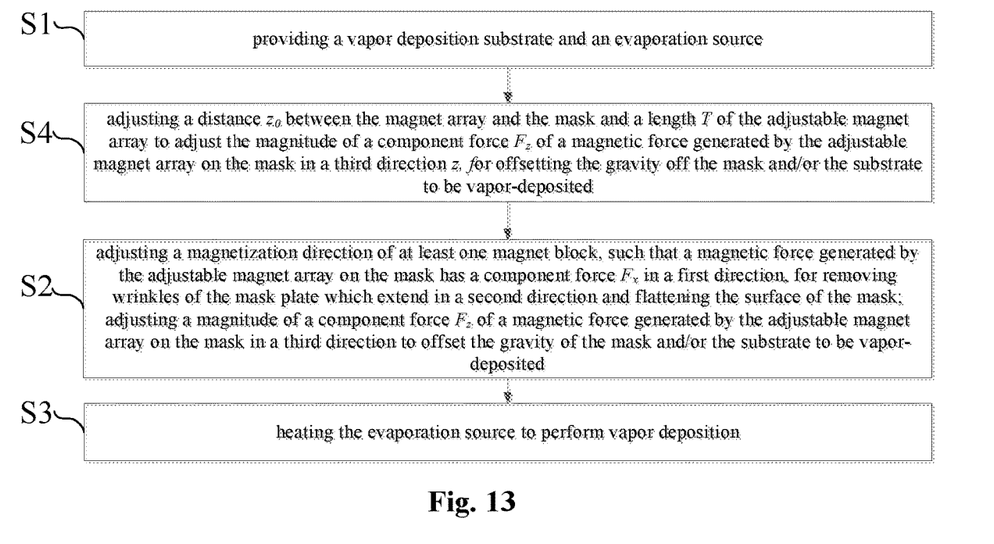
FIG. 13 is yet another schematic flowchart of a vapor deposition method according to an embodiment of the present disclosure.

The vapor deposition method further includes a step S4: adjusting the distance $z_0$ between the magnet array and the mask and the length T of the adjustable magnet array to adjust the magnitude of a component force $F_z$ of the magnetic force generated by the adjustable magnet array on the mask in the third direction z, so as to offset the gravity of the mask and/or the substrate to be vapor-deposited. Exemplarily, step S4 may be between step S2 and step S1. FIG. 13 illustrates another schematic flowchart of the vapor deposition method according to an embodiment of the present disclosure, in which step S4 may also be between step S2 and step S3, or may be performed in parallel with step S2. The specific position of step S4 is not limited in the present embodiment.

In particular, the step of adjusting the magnetization direction of at least one magnet block, such that the magnetic force generated by the adjustable magnet array on the mask has a component force Fx in the first direction x includes the following two manners.

Figure 14:
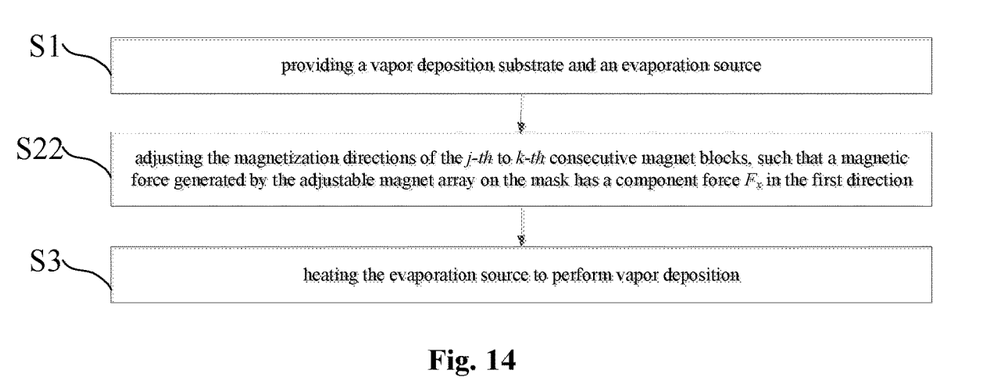
FIG. 14 is yet another schematic flowchart of a vapor deposition method according to an embodiment of the present disclosure.

For the first manner, FIG. 14 is yet another schematic flowchart of the vapor deposition method according to the embodiment of the present disclosure. The vapor deposition method includes a step S22: adjusting the magnetization directions of the j-th to k-th consecutive magnet blocks, such that a magnetic force generated by the adjustable magnet array on the mask has a component force $F_x$ in the first direction x.

Figure 15:
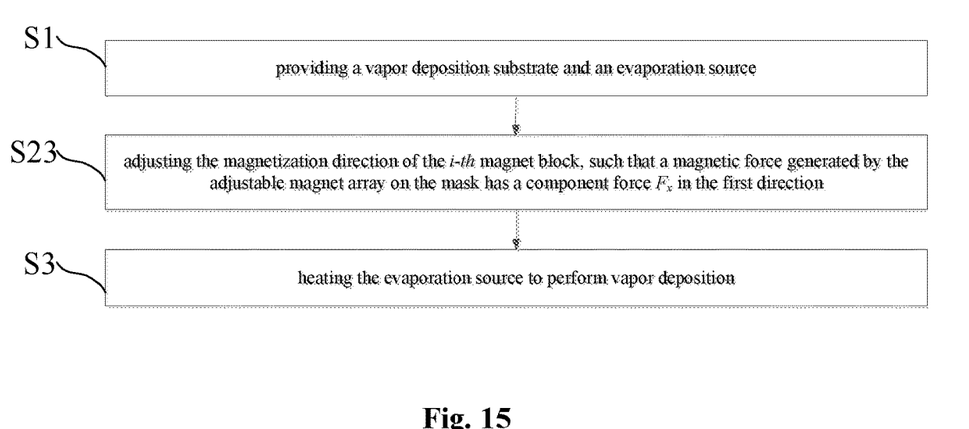
FIG. 15 is yet another schematic flowchart of a vapor deposition method according to an embodiment of the present disclosure.

For the second manner, FIG. 15 is yet another schematic flowchart of the vapor deposition method according to the embodiment of the present disclosure. The vapor deposition method includes a step S23: adjusting the magnetization directions of the i-th magnet block, such that a magnetic force generated by the adjustable magnet array on the mask has a component force $F_x$ in the first direction x.

It should be noted that step S23 and step S22 are two parallel embodiments. The adjustable magnet array may be adjusted by step S23, or by step S22, or by combining steps S22 with S23 in the process of adjusting the adjustable magnet array. The specific adjustment manner may be determined according to the arrangement of the specific adjustable magnet array.

In a specific embodiment, the method of adjusting the magnetization direction of at least one magnet block includes: adjusting the magnetization direction of the magnet block manually or using a motor. The specific adjustment manner may be selected according to a specific adjustable magnet array.

In an implementation, prior to heating the evaporation source to perform vapor deposition, the vapor deposition method further includes: vacuumizing the vapor deposition device to a preset vacuum degree.

The above-mentioned vapor deposition method is applicable to the above-mentioned vapor deposition device. After at least one magnet block in the adjustable magnet array is adjusted, the adjustable magnet array has a component force $F_x$ in the first direction x to remove the wrinkles of the mask, which are generated in the second direction y, so that the surface of the mask is flat. In addition, the gravity of the mask may be removed by adjusting the magnitude of the component force $F_z$ of the adjustable magnet array on the mask in the third direction z.

It should be illustrated eventually that: the above embodiments are only used to illustrate the technical solutions of the present disclosure, rather than limiting them. Although the present disclosure has been described in detail with reference to the foregoing embodiments, an ordinary person skilled in the art should understand that it is still possible to modify the technical solutions described in the foregoing embodiments, or to equivalently replace some or all of the technical features. However, these modifications or replacements do not make the essence of the corresponding technical solution depart from the scope of the technical solutions of the embodiments of the present disclosure.

What is claimed is:

1. A vapor deposition device, comprising an adjustable magnet array and a mask, wherein
the adjustable magnet array comprises m magnet blocks, where m is a positive integer greater than or equal to 1, wherein at least one of the m magnet blocks is rotatable to adjust a magnetization direction of the at least one of the m magnet blocks to generate a magnetic force on the mask, wherein the magnetic force has a component force $F_x$ in a first direction and a component force $F_z$ in a third direction, wherein the component force $F_x$ is for removing wrinkles extending in a second direction on the mask and flattening a surface of the mask, and the component force $F_z$ is for offsetting a gravity of the mask,
wherein two ends of the mask in the second direction are fixed on a mask frame, the mask is stretched in the second direction, and the second direction is perpendicular to the first direction,
wherein the m magnet blocks are arranged along the first direction, and a rotation axis of each of the at least one of the m magnet blocks extends in the second direction.

2. The vapor deposition device according to claim 1, wherein
the adjustable magnet array is composed of the m magnet blocks;
the m magnet blocks comprise at least one magnetization unit;
each magnetization unit of the at least one magnetization unit comprises N magnet blocks of the m magnet blocks which are arranged consecutively, and a magnetization direction of each magnetization unit is continuously precessed from an angle $\alpha$ to an angle $\beta$ clockwise or counterclockwise, where $0°<|\beta-\alpha|\leq360°$;
a length of each magnetization unit in the first direction is T, which is obtained from the following formula:
$T=N(D+s)$,
wherein $N\geq1$, D represents a size of each magnet block of the N magnet blocks in the first direction, and s represents a gap between two adjacent magnet blocks of the N magnet blocks.

3. The vapor deposition device according to claim 2, wherein each of them magnet blocks is in a shape of a cylinder.

4. The vapor deposition device according to claim 2, wherein $|\beta-\alpha|=360°$.

5. The vapor deposition device according to claim 2, wherein a distance between the adjustable magnet array and the mask in the third direction is $z_0$, wherein T and $z_0$ are adjustable to adjust magnitudes of the component force $F_z$ in the third direction and the component force $F_x$ in the first direction.

6. The vapor deposition device according to claim 1, wherein
the at least one of the m magnet blocks comprises j-th to k-th consecutive magnet blocks of the m magnet blocks, wherein $1\leq j\leq k\leq m$.

7. The vapor deposition device according to claim 6, wherein
the magnetization directions of the j-th to k-th consecutive magnet blocks are adjusted in a manner in which a magnetization direction of each of the j-th to k-th consecutive magnet blocks is precessed by an angle $\theta$, wherein $0°<\theta<360°$.

* * * * *